United States Patent [19]

Katto

[11] 4,121,240
[45] Oct. 17, 1978

[54] SEMICONDUCTOR DEVICE HAVING A DISCHARGE-FORMED INSULATING FILM

[75] Inventor: Hisao Katto, Hinode, Japan

[73] Assignee: Hitachi, Ltd., Japan

[21] Appl. No.: 670,831

[22] Filed: Mar. 26, 1976

[30] Foreign Application Priority Data

Mar. 26, 1975 [JP] Japan .................................. 50-35568

[51] Int. Cl.² .................... H01L 29/34; H01L 29/04; H01L 29/46
[52] U.S. Cl. ........................................ 357/52; 357/54; 357/59; 357/71; 357/23; 204/192 S
[58] Field of Search .................. 357/52, 59, 71, 54, 357/2

[56] References Cited

U.S. PATENT DOCUMENTS

| | | | |
|---|---|---|---|
| 3,585,461 | 6/1971 | Eynon et al. | 357/71 |
| 3,611,070 | 10/1971 | Engeler | 357/59 |
| 3,827,949 | 8/1974 | Platter et al. | 357/54 |
| 3,881,971 | 5/1975 | Greer et al. | 357/71 |
| 3,996,657 | 12/1976 | Simko et al. | 357/59 |
| 4,009,483 | 2/1977 | Clark | 357/52 |
| 4,040,083 | 8/1977 | Saiki et al. | 357/54 |

FOREIGN PATENT DOCUMENTS 2,031,082  4/1971  Fed. Rep. of Germany ............ 357/53

OTHER PUBLICATIONS

Grosewald et al. "Reducing Radiation Damage in Insulated-Gate Field-Effect Transistors" IBM Tech. Disclosure Bulletin, vol. 14 (8/71), pp. 811–812.

Harding et al. "Universal Monolithic Circuit and Method of Fabrication" IBM Tech. Disclosure Bulletin, vol. 8 (10/65), pp. 804–805.

Primary Examiner—William D. Larkins
Assistant Examiner—Gene M. Munson
Attorney, Agent, or Firm—Craig & Antonelli

[57] ABSTRACT

A semiconductor device comprises a semiconductor chip including a conductive layer thereon, a film of Si disposed on the surface of the chip, and an insulating film of SiO₂ disposed on said Si film, which is formed by a sputtering or a glow discharge method.

4 Claims, 15 Drawing Figures

SEMICONDUCTOR DEVICE HAVING A DISCHARGE-FORMED INSULATING FILM

The present invention relates to a semiconductor device, and more particularly to a semiconductor device having a protective film on the surface thereof, and a method for fabricating the same.

In semiconductor devices, it has been necessary to keep pure the materials for the device in fabrication steps for preventing degradations in electrical characteristics, to cover the surface of the device and of metal wirings with a protective film consisting mainly of $SiO_2$ for protecting the semiconductor surface from contaminations, and further to dispose the device in an evacuated metal container for intercepting influences of the outside environment. However, it has been requested of late to replace the metal container by resins for molding the device, since the container is more expensive than the resins, or even not to dispose the device in any type of container at all for obtaining a small-sized device. For the above requests, the requirement for the protective film becomes more severe.

In conventional semiconductor devices, though $SiO_2$ film or phospho-silicate glass film which is formed by a chemical vapor deposition method is widely utilized as the protective film, this protective film is not sufficient for the protection of the devices, since, when the thickness of the film is thicker than about 1.5 $\mu$m, cracks are generated in the film, and hence the film thickness must be thinner than 1.5 $\mu$m. This results in the abundance of pinholes in the oxide film, and the poor coverage at the steps of the wirings. Consequently, the protection against the outside environment becomes incomplete, such that there is a limit for preventing the corrosion of wirings of e.g. aluminum.

For overcoming the above-described drawbacks of the $SiO_2$ film or the phospho-silicate glass film formed by the chemical vapor deposition method, an insulating film being able to have a higher denseness and to be made thicker than those of said $SiO_2$ film or phospho-silicate glass film formed by the chemical vapor deposition method is required.

It is well known in the art that an insulating film having a thickness thicker than and a denseness higher than those of said $SiO_2$ or said phospho-silicate glass film is formed by a method utilizing discharge phenomenon, especially a sputtering method. Therefore, the insulating film formed by the method utilizing discharge phenomenon is preferable for the protective film.

However, it is also well known in the art that damages are caused at a surface of a semiconductor body wherein circuit elements are disposed, by the method utilizing discharge phenomenon. Though the mechanism of the generation of damages has not yet been made clear, it is considered that damages are caused by electron bombardment, ion bombardment, and/or sodium contamination in $SiO_2$, etc., especially by the fact that electron-hole pairs are generated at surface portions of an insulating film disposed on the surface of the semiconductor body by the electron and ion bombardment, the generated electron-hole pairs move to the surface of the semiconductor surface, and fixed charges are generated. Though it is further well known in the art that these damages are recovered by a heat treatment at a temperature higher than about 1000° C., it is difficult to adopt this heat treatment to semiconductor devices utilizing metal wirings, since usually aluminum whose melting point is low is utilized for the metal wirings or conductive layers.

Therefore, though the insulating film formed by the method utilizing discharge phenomenon has preferable characteristics as a protective film, it is not suitable for the usual semiconductor devices, especially for integrated circuit devices wherein metal-oxide-semiconductor (MOS) devices which are very sensitive to the damages described above are utilized.

It is, therefore, an object of the present invention to provide a semiconductor device having a superior protection from the outside environment.

It is another object of the present invention to provide a method for fabricating a semiconductor device having a superior protection from the outside environment.

These objects are attained by providing a protective film consisting of a semiconductor film and an insulating film formed by the method utilizing discharge phenomenon on a surface of a semiconductor chip including a conductive layer thereon.

The semiconductor film, when it does not include a large amount of impurities, is a material whose resistance is large and whose forbidden band is narrow as compared to the insulating film, and restrains a generation of damages, at a surface near a semiconductor body, which will be caused by charged particles, such as electrons or ions plunging into an insulating layer disposed on the surface of the semiconductor body when the insulating film is formed by the method utilizing discharge phenomenon on the surface of the semiconductor chip, since the semiconductor film permits the charged particles to be freed.

It should also be noted that, during the formation of the insulating film on the semiconductor film, the conductivity of the semiconductor film can increase so as to be several orders of magnitude as high as the conductivity of the semiconductor film before the formation of the insulating film, since the temperature of the semiconductor chip, and hence the temperature of the semiconductor film rises during the formation of the insulating film on the semiconductor film. It is preferable to contact the semiconductor film with a semiconductor body consisting the semiconductor chip or to ground the semiconductor film. It is also preferable that the semiconductor chip be heated for controlling the conductivity of the semiconductor film.

According to the present invention, though there is a semiconductor film between the insulating film and the semiconductor chip and the semiconductor film has a contact with the metal wiring or conductive layer, there are very small electrical influences of the semiconductor film to the semiconductor device, since the resistance of the semiconductor film which is not doped with a large amount of impurities therein is high at around room temperature at which semiconductor devices are operated, though there is a very small amount of leakage current.

The semiconductor film becomes a superior protective film for intercepting sodium and water which easily pass through $SiO_2$ film and which give undesirable influences to the semiconductor device and the metal wirings.

The semiconductor film may include impurities being effective for gettering sodium, such as phosphorus and/or boron therein. However, the amount of the impurities should be small, since it is preferable for the semiconductor film that the influence in capacitance and resistance to the semiconductor device be minimized.

The semiconductor film may be in a single crystalline state, a poly-crystalline state and an amorphous state. At the present state of technology on the formation of the semiconductor film at low temperatures, the poly-crystalline state or the amorphous state is preferable.

Other objects, features and advantages of the present invention will be apparent from the following detailed description of some preferred embodiments thereof taken in conjunction with the accompanying drawings wherein like reference numerals are used to denote like parts.

Figure 1:
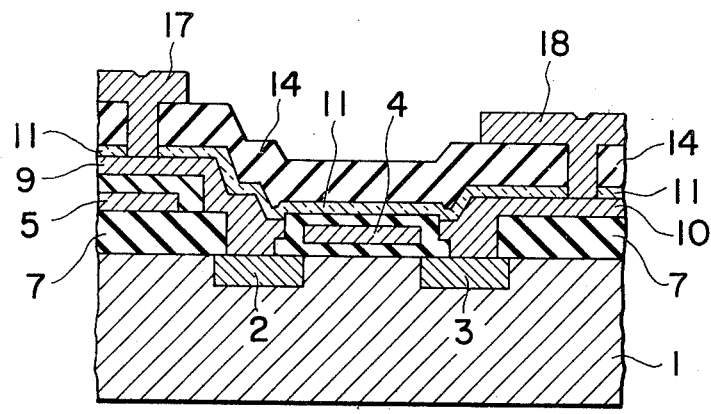
FIG. 1 is a cross sectional view of a semiconductor device according to one embodiment of the present invention.

FIG. 1 is a cross sectional view of a semiconductor device according to the present invention, which comprises an n-type Si body 1, p-type semiconductor regions 2 and 3 disposed separately in the n-type Si body 1, a $SiO_2$ layer 7 wherein a polycrystalline Si layer 4 which functions as a gate electrode and a first wiring 5 are disposed at portions corresponding to a portion of the Si body 1 between the Si body 1 other than the semiconductor regions 2 and 3 and said portion of the Si body 1 between the semiconductor regions 2 and 3, respectively, first and second metal conductors 9 and 10 connected to said semiconductor regions 2 and 3, respectively, a polycrystalline Si film 11 disposed on the surfaces of said $SiO_2$ layer 7 and of said first and second metal conductors 9 and 10, a $SiO_2$ film 14, formed by the method utilizing discharge phenomenon, disposed on said polycrystalline Si film 11, and third and fourth metal conductors 17 and 18 connected to said first and second metal conductors 9 and 10 through said polycrystalline Si film 11 and said $SiO_2$ film 14.

Though, in this device, the thickness of the $SiO_2$ film 14 is of about 3 $\mu$m, no cracks are found therein. This film is superior to a $SiO_2$ film formed by the chemical vapor deposition method, since there are found many cracks when the $SiO_2$ film is formed by the chemical vapor deposition method so as to have a thickness thicker than 1.5 $\mu$m.

Further, an aberration of a threshold voltage $V_T$ of the semiconductor device shown in FIG. 1, i.e. a MOSFET versus a from MOSFET on which no Si film 11 and $SiO_2$ film 14 are disposed, which is caused by damages in the method utilizing discharge phenomenon is not so larger when compared with that of a MOSFET which has almost the same structure as that shown in FIG. 1 except the Si film 11, i.e. which does not have any Si film 11 on the $SiO_2$ layer 7 and on the first and second metal conductors 9 and 10, but the $SiO_2$ film 14 formed by the method utilizing discharge phenomenon.

This fact will be apparent from Table I showing experimental data obtained by the present inventor wherein threshold voltages of MOSFETs, which do not have Si film 11 and $SiO_2$ film 14, (a); only have $SiO_2$ film of 1.5 $\mu$m in thickness formed by the chemical vapor deposition method (CVD), (b); only have $SiO_2$ film of 3 $\mu$m in thickness, (c); only have Si film of 1.0 $\mu$m in thickness formed by an electron-beam evaporation method, (d); have Si film 11 of 0.1 $\mu$m in thickness formed by the electronbeam evaporation method and $SiO_2$ film 14 of 3 $\mu$m in thickness formed by the method utilizing discharge phenomenon, (e); and have Si film 11 of 0.5 $\mu$m in thickness formed by a sputtering method and $SiO_2$ film 14 of 3 $\mu$m in thickness formed by the method utilizing discharge phenomenon, (f), on the surfaces of the $SiO_2$ layer 7 and of the first and second metal conductors 9 and 10 are shown.

Table I

| | Si film | $SiO_2$ film | Threshold Voltage |
|---|---|---|---|
| (a) | No | No | −0.5 V |
| (b) | No | Yes (1.5 $\mu$m; formed by CVD method) | −0.6 V |
| (c) | No | Yes (3 $\mu$m: formed by sputtering method) | −10~ −50 V |
| (d) | Yes (1.0 $\mu$m: formed by electron-beam evaporation method) | No | −0.7 V |
| (e) | Yes (0.1 $\mu$m: formed by electron-beam evaporation method) | Yes (3 $\mu$m: formed by sputtering method) | −0.8 V |
| (f) | Yes (0.5 $\mu$m: formed by sputtering method) | Yes (3 $\mu$m: formed by sputtering method) | −1.5 V |

Though MOSFETs of the present invention have threshold voltages of −0.8 V and −1.5 V, which have aberrations by −0.3 V and −1.0 V from the threshold voltage −0.5 V of MOSFET on which no Si film 11 and $SiO_2$ film 14 are disposed, these aberrations can be removed by heat treating the resultant devices at a temperature between 300°–500° C. in nitrogen gas or hydrogen gas, which is well known in the art.

While the aberration of the threshold voltage of MOSFET which does not have Si film, but $SiO_2$ film formed by the method utilizing discharge phenomenon, (d), can not be removed, only 10% thereof is increased. Therefore, this device can not be utilized as MOSFET.

It has been recognized by the present inventor that the device of the present invention is superior to the devices (a), (b), (c) and (d) shown in Table I, concerning the errosion of metal conductors, such as Al, a shift of the threshold voltage, a leakage current at junctions, etc. in a life test, i.e. a bias-temperature (B-T) test at a high temperature in a very wet atmosphere, which is well known in the art.

It has also been recognized by the present inventor that the presence of a semiconductor layer in the present invention does not influence the high-speed pulse operation of the device and hence can be utilized for shift-resistors, ring counters, and even dynamic memories, wherein MOSFETs are utilized, though it had been feared that electric characteristics of the device had been influenced by resistance- and/or capacity-coupling of Si film. Though the resistivity of the Si film increases to $10^4$ $\Omega$cm at a temperature of about 150° C. from $2 \times 10^6$ $\Omega$cm at room temperature, the device of the present invention can practically be utilized, since the resistance between terminals of the device is usually $10^8$–$10^9$ $\Omega$.

Further, though it had been feared that damages would be caused by the step of forming the Si film by the sputtering method, it has been recognized that no damages have been caused. The reason why no damages are caused is not yet clear, it is considered that the very thin Si film formed at the very early stage intercepts the influence of the subsequent discharge.

This device shown in FIG. 1 is formed by the steps of diffusing impurities into an n-type Si body 1 at predetermined portions so as to form p-type semiconductor regions 2 and 3, forming $SiO_2$ layer 7 wherein polycrystalline Si layer 4 doped with impurities is included, forming first and second metal conductors 9 and 10 connected to said semiconductor regions 2 and 3, respectively, forming a polycrystalline or amorphous Si film 11 on the surfaces of said $SiO_2$ layer 7 and of said first and second metal conductors 9 and 10 by an electron-beam evaporation method or a sputtering method, forming $SiO_2$ film 14 having a thickness of 3 $\mu$m on the surface of said Si film by the sputtering method and forming third and fourth metal conductors 17 and 18 so as to contact with said first and second metal conductors 9 and 10, respectively, through said $SiO_2$ film 14 and said Si film 11.

Another embodiment of the method of the present invention is explained by referring to FIGS. 2a through 2d.

Figure 2A:
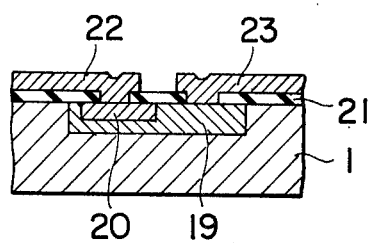
FIGS. 2a through 2d are cross sectional views of a semiconductor device for explaining one embodiment of the method of the present invention.

In FIG. 2a, it is shown that a semiconductor chip which comprises an n-type Si body 1, a p-type semiconductor region 19 disposed in said body 1, an n-type semiconductor region 20 disposed in said p-type semiconductor region 19, an insulating layer 21 of $SiO_2$ disposed on the surface of the body 1, and metal conductors 22 and 23 connected to said n-type and p-type semiconductor regions 20 and 19, respectively.

Figure 2B:
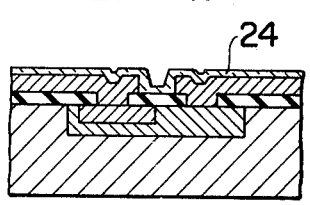

On the surface of this chip shown in FIG. 2a, an amorphous Si film 24 is formed by the chemical vapor deposition method (FIG. 2b).

Figure 2C:
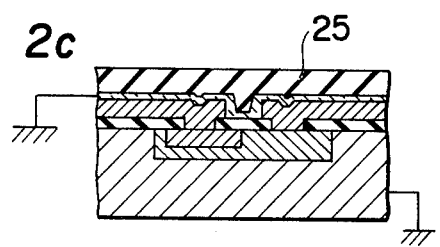

Then, after the Si film 24 and the body 1 are connected with each other by a conductive material, the resultant device is introduced into an apparatus for sputtering which is Model ASP-662 sold by Nichiden-Varian. Under the condition of: Ar pressure in an inert gas of $5 \times 10^{-3}$ Torr, electric power of 1.5 KW, rf of 13.5 MHz and a temperature of the chip of 400° C., $SiO_2$ film 25 having a thickness of about 3 $\mu$m is formed on the surface of the Si film 24 at a piling up rate of 150 Å/min (FIG. 2c).

Figure 2D:
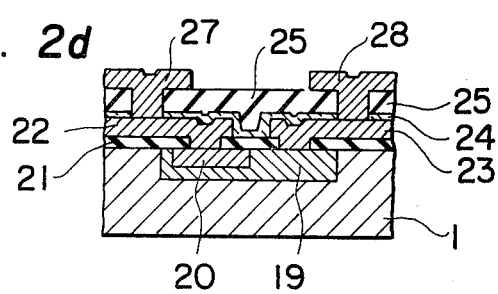

Through-holes are formed by etching the $SiO_2$ film 25 and the Si film 24 so as to extend from the surface of the $SiO_2$ film 25 to the surface of the metal conductors 22 and 23, and metal conductors 26 and 27 are formed so as to contact with metal conductors 22 and 23, respectively (FIG. 2d).

Figure 3A:
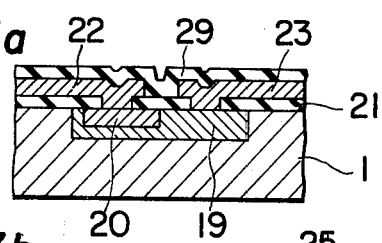
FIGS. 3a through 3c are cross sectional views of a semiconductor device for explaining another embodiment of the method of the present invention.
Figure 3B:
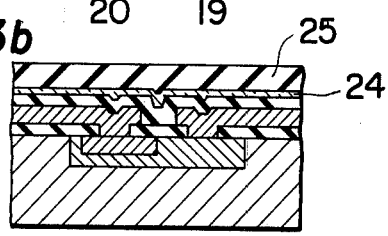
Figure 3C:
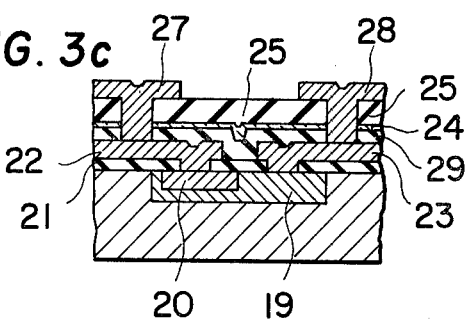

FIGS. 3a through 3c are cross sectional views of a semiconductor device for explaining another embodiment of the method of the present invention.

In FIG. 3a, a semiconductor chip which has a $SiO_2$ layer 29 on the surface of the semiconductor chip shown in FIG. 2a is shown.

On the surface of the $SiO_2$ layer 29, the amorphous Si film 24 and the $SiO_2$ film 25 are formed by the method described above (FIG. 3b). After the predetermined portions of the $SiO_2$ film 25, the Si film 24 and the $SiO_2$ layer 29 are etched, metal conductors 27 and 28 are formed so as to contact with the metal conductors 22 and 23, respectively (FIG. 3c).

This semiconductor device shown in FIG. 3c is superior to the device shown in FIG. 2d in the obstructions of the leakage current and of the capacitance between the metal conductors, since the $SiO_2$ layer 29 is disposed between the Si film 24 and the surface of the semiconductor chip.

A further embodiment of the method of the present invention will be explained by referring to FIGS. 4a through 4c.

Figure 4A:
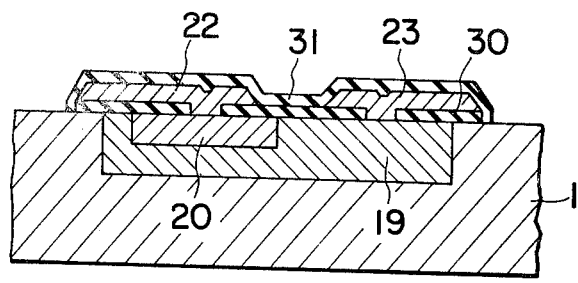
FIGS. 4a through 4c are cross sectional views of a semiconductor device for explaining a further embodiment of the method of the present invention.

In FIG. 4a, there is shown a semiconductor chip which comprises an n-type Si body 1, a p-type semiconductor region 19 disposed in the Si body 1, an n-type semiconductor region 20 disposed in the p-type semiconductor region 19, an insulating layer 30 of $SiO_2$ disposed on the surface of the Si body 1 so as to cover junctions exposed at the surface of the body 1, metal conductors 22 and 23 connected to the n-type semiconductor region 20 and the p-type semiconductor region 19, respectively, through the $SiO_2$ layer 30, and a phospho-silicate glass layer 31 disposed on the surfaces of the metal conductors 22 and 23.

Figure 4B:
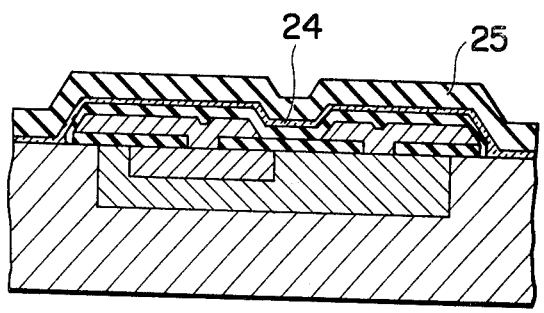

On the surfaces of the body 1 and of the phospho-silicate glass layer 31, an amorphous Si film 24 and an insulating film 25 of $SiO_2$ are successively formed (FIG. 4b). In the formation of the $SiO_2$ film 25, a plasma chemical vapor deposition method (or, a glow discharge method) which is well known in the art is employed. That is, the device on which the amorphous Si film 24 is disposed is heated at a temperature of 300° C. in an atmosphere of oxygen and tetraethoxysilane under the condition of rf of 400 KHz, 5 KV, whereby the $SiO_2$ film 25 having a thickness of 3 $\mu$m is formed at a piling up rate of 150 Å/min.

Figure 4C:
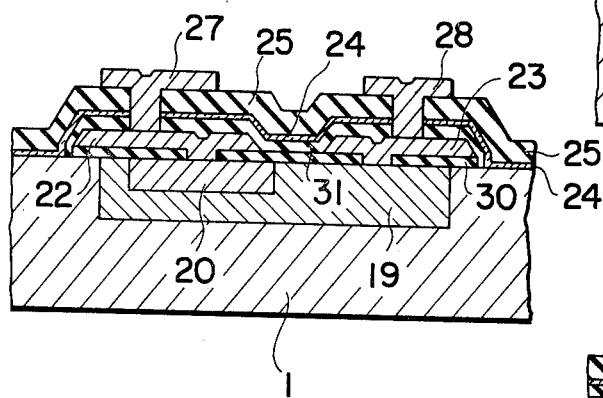
Figure 5D:
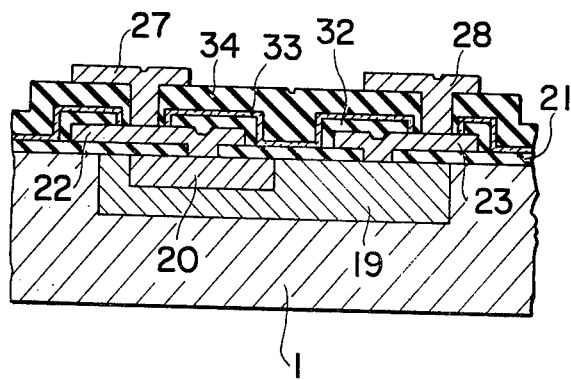

After these steps, the metal conductors 27 and 28 are formed by the steps of etching predetermined portions of the $SiO_2$ film 25, the Si film 24 and the phospho-silicate glass layer 31 so as to expose predetermined surface portions of the metal conductors 22 and 23 and of forming metal conductors 27 and 28 so as to connect to the metal conductors 22 and 23, respectively (FIG. 4c).

This method is superior to the method for fabricating the semiconductor device shown in FIG. 2d, since, in this method, the amorphous Si film 24 is connected to the body 1 and hence it is unnecessary to contact the Si film with the body by the conductive material as is in the method for fabricating the semiconductor device shown in FIG. 2d.

A still further embodiment of the method of the present invention is explained by referring to FIGS. 5a through 5d.

Figure 5A:
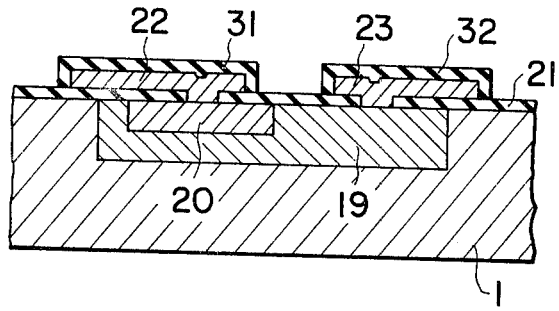
FIGS. 5a through 5d are cross sectional views of a semiconductor device for explaining still a further embodiment of the method of the present invention.

FIG. 5a shows a semiconductor chip comprising an n-type Si body 1, a p-type semiconductor region 19 disposed in the body 1, an n-type semiconductor region 20 disposed in the p-type semiconductor region 19, an insulating layer 21 of $SiO_2$ disposed on the surface of the body 1, metal conductors 22 and 23 connected to the n-type and p-type semiconductor regions 20 and 19, respectively, through the $SiO_2$ layer 21, and phospho-silicate glass layers 31 and 32 disposed only on the surfaces of the metal conductors 22 and 23, respectively.

Figure 5B:
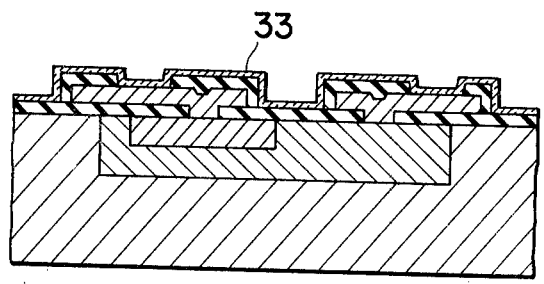

Predetermined portions of the phospho-silicate glass layers 31 and 32 are etched so as to expose predetermined portions of the metal conductors 22 and 23, and on the surface of the semiconductor chip, a polycrystalline Si film 33 is formed by the sputtering method which is well known in the art (FIG. 5b).

Figure 5C:
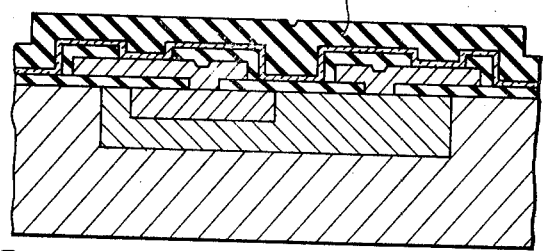

On the surface of the Si film 33, an insulating film 34 of $SiO_2$ having a thickness of 3 $\mu$m is formed by utilizing the step of forming the SiO₂ film 25 in the method for fabricating the semiconductor device shown in FIG. 4c(FIG. 5c).

Metal conductors 27 and 28 are formed by the steps of etching the portions of the SiO₂ film 34, the Si film 33 corresponding to the predetermined portions of the metal conductors 22 and 23 thereby forming throughholes extending from the surface of the SiO₂ film 34 to the surfaces of the metal conductors 22 and 23, of evaporating metal on the surfaces of the SiO₂ film 34 and on the exposed surfaces of the metal conductors 22 and 23, and of selectively etching the evaporated metal.

Though the preferred embodiments of the present invention have been described above, the present invention is not limited to these embodiments.

For example, though the Si film is formed by the chemical vapor deposition method, the electron-beam evaporation method or the sputtering method, it may be formed by any other possible methods.

Though, in some embodiments, the SiO₂ layer or the phospho-silicate glass layer is formed between the semiconductor chip and the Si film, other insulating materials may be utilized.

In the embodiments, the thickness of the Si film has not been restrictively stated, but any practical thicknesses may be utilized. Attention should be directed to that the thickness of the Si film should be as thin as possible, when the semiconductor device having a very weak leakage current, such as linear integrated circuit devices, is required. It is also noted that thick Si films whose thickness is thicker than about 4000 Å are not transparent to visible light and make it difficult to visually inspect the device. On the other hand, the Si film would be preferably over about 500 Å in thickness, so that the film may be practically regarded as a continuous film.

Further, though, in the embodiments, the Si film and the SiO₂ film are utilized, other semiconductor films, such as Ge film, GaAs film, etc. and other insulating films, such as Si₃N₄ film, Al₂O₃ film, etc. may be utilized, respectively.

Furthermore, though the metal conductors are utilized in the embodiments, any kinds of conductors, such as semiconductors doped with impurities, may be utilized.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

What is claimed is:

1. A semiconductor device comprising
a semiconductor body including a semiconductor circuit element therein;
an insulating layer selectively disposed on the surface of said body and having at least one opening therethrough so as to expose at least one surface portion of said body;
a conductive layer selectively disposed on the surface of said insulating layer so as to expose at least one surface portion of said insulating layer, said conductive layer extending through said at least one opening through said insulating layer and contacting said at least one exposed surface portion of said body;
a protection layer disposed on both said conductive layer and said insulating layer, said protection layer including a semiconductor film overlying each portion of said conductive layer and said insulating layer on which said protection layer is disposed; and
a discharge-formed insulating film disposed on said semiconductor film,
wherein each of said protection layer and said insulating film has at least one aperture therethrough exposing at least one surface portion of said conductive layer, and further including a conductive contact layer disposed on said insulating film and extending through an aperture in each of said protection layer and said insulating film to contact said conductive layer.

2. A semiconductor device comprising
a semiconductor body including a semiconductor circuit element therein;
an insulating layer selectively disposed on the surface of said body and having at least one opening therethrough so as to expose at least one surface portion of said body;
a conductive layer selectively disposed on the surface of said insulating layer so as to expose at least one surface portion of said insulating layer, said conductive layer extending through said at least one opening through said insulating layer and contacting said at least one exposed surface portion of said body;
a protection layer disposed on both said conductive layer and said insulating layer, said protection layer including a semiconductor film overlying each portion of said conductive layer and said insulating layer on which said protection layer is disposed wherein said semiconductor film is disposed directly on said conductive layer and said insulating layer; and
a discharge-formed insulating film disposed on said semiconductor film,
wherein each of said protection layer and said insulating film has at least one aperture therethrough exposing at least one surface portion of said conductive layer, and further including a conductive contact layer disposed on said insulating film and extending through an aperture in each of said protection layer and said insulating film to contact said conductive layer.

3. A semiconductor device comprising
a semiconductor body including a semiconductor circuit element therein;
an insulating layer selectively disposed on the surface of said body and having at least one opening therethrough so as to expose at least one surface portion of said body;
a conductive layer selectively disposed on the surface of said insulating layer so as to expose at least one surface portion of said insulating layer, said conductive layer extending through said at least one opening through said insulating layer and contacting said at least one exposed surface portion of said body;
a protection layer disposed on both said conductive layer and said insulating layer, said protection layer including a semiconductor film overlying each portion of said conductive layer and said insulating layer on which said protection layer is disposed; and a discharge-formed insulating film disposed on said semiconductor film, wherein said protection layer contains an insulation layer disposed directly upon said insulating layer and said conductive layer, said semiconductor film being disposed directly upon said insulation layer.

4. A semiconductor device according to claim 3, wherein each of said protection layer and said insulating film has at least one aperture therethrough exposing at least one surface portion of said conductive layer, and further including a conductive contact layer disposed on said insulating film and extending through an aperture in each of said protection layer and said insulating film to contact said conductive layer.

* * * * *